Feb. 6, 1968 H. FISHMAN ET AL 3,368,122

SEMICONDUCTOR DEVICES

Filed Oct. 14, 1965

INVENTORS:
HERBERT FISHMAN,
JOHN N. FRANK,
BY [signature]
THEIR ATTORNEY.

United States Patent Office 3,368,122

Patented Feb. 6, 1968

3,368,122

SEMICONDUCTOR DEVICES

Herbert Fishman, Syracuse, and John N. Frank, Auburn, N.Y., assignors to General Electric Company, a corporation of New York Filed Oct. 14, 1965, Ser. No. 496,069
13 Claims. (Cl. 317—234)

ABSTRACT OF THE DISCLOSURE

In a semiconductor junction type rectifying device wherein a semiconductor pellet is mounted on or between electrically conductive supporting members or plates, the difference in thermal coefficient of expansion between the semiconductor material and supporting plates is compensated by making at least one supporting plate a relatively thin disk-like member with two major opposed surfaces composed of a composite body having at least one highly conductive (thermally and electrically) disk-shaped member with a relatively high thermal coefficient of expansion surrounded and confined by a conductive material which has a much lower thermal coefficient of expansion so that the surrounding material constrains expansion of the more highly expansive material.

This invention relates to semiconductor devices of the rectifying junction type as rectifiers, transistors, and controlled rectifiers which utilize semiconductor bodies, for example, monocrystalline bodies of germanium or silicon.

The semiconductor element in such devices are highly susceptible to contamination and for that reason, are generally encapsulated in a housing which is evacuated or filled with protective gas. The housing in which the device is enclosed must provide both for good electrical and thermal conductivity in order to minimize device voltage drop and maximize dissipation of heat from the semiconductor element. As a consequence, at least a portion of the housing and the leads or conductors to and from the semiconductor element usually consist of a highly conductive material such as copper.

Due, among other things, to its brittleness, to the fact that its coefficient of expansion differs from that of copper, it is extremely difficult to mount the semiconductor element directly on or to the copper conductors of the housing. It has been proposed to reduce stresses in the semiconductor body that result from differences in coefficients of expansion between the semiconductor body and the materials to which it is mounted by using solders (called soft solders) between the materials which will relax when subjected to stresses and strains. This has not been a well received method in devices which require both high reliability and many rapid switching cycles due to the fact that upon thermal cycling soft solders fatigue rapidly and destroy the usefulness of the device.

It has also been proposed to reduce the strain in the semiconductor device by insertion of intermediate bodies which at least partially bridge or compensate the difference between thermal coefficients of expansion. By just reducing the stresses in the solder layers as well as the semiconductor body, the permanent strength of the solder, and hence the useful lifetime of the entire semiconductor device, can be increased considerably while at the same time greatly reducing the possibility of fracturing the fragile semiconductor element of the device. As indicated, this is particularly significant for semiconductor devices which are normally operated in applications which require them to be frequently switched on and off. For example, in high frequency inverters.

Some of the materials which have been utilized as backup plates surrounding the semiconductor material for reducing the stress in the semiconductor bodies are molybdenum, Fernico (an alloy of 54% iron, 29% nickel and 17% cobalt), and tungsten. These materials each have a number of shortcomings. For example, molybdenum and tungsten are expensive, do not have as good thermal and electrical conductivity as is generally desired, and are extremely difficult to solder. Fernico is not so expensive, but its thermal coefficient of expansion does not match that of the semiconductor body as well as is generally desired, and its thermal and electrical conductivity leave much to be desired.

Accordingly, it is an object of the present invention to provide a semiconductor device structure wherein stresses in the semiconductor body are reduced by supporting members, which members provide both thermal and electrical conductivity desired.

In a semiconductor device of the type in which the present invention has particular application (a controlled rectifier) one electrical connector is provided to one side of the device while two electrical connectors are provided on the opposite side of the device. One of the two electrical connectors constitutes an annular electrode. When providing such a structure, it becomes more difficult to provide support plates on both sides of the device and at the same time, reduce stress in the semiconductor body to a point where the semiconductor body is not fractured under thermal cycling.

Accordingly, it is another object of the present invention to provide a structure which reduces stress in the semiconductor body below the fracturing point for device thermal cycling for a semiconductor device wherein one electrical connection is made to one side of the semiconductor body and two connections are made to the opposite sides, with one of the two connections being an annular support plate.

In carrying out the invention in one form as applied to semiconductor devices, there is provided a wafer of semiconductor material which is bonded on one side to a metal support plate which plate is a composite structure formed of one material having a high electrical and thermal conductivity and a coefficient of thermal expansion greater than that of the semiconductor material surrounded and confined by another material having a lower thermal coefficient of expansion than the material thus surrounded. In an embodiment where an annular electrode is provided on the opposite side of the semiconductor body from the composite support plate a supporting member having the configuration of the bounding (or restraining) material on the opposite side and a like coefficient of thermal expansion is provided in order to help reduce stress in the semiconductor body.

The novel features which are believed to be characteristic of the invention are set forth with particularity in the appended claims. The invention itself, however, both as to its organization and method of operation, together with further objects and advantages thereof, may best be understood by reference to the following description taken in connection with the accompanying drawing in which:

Figures 1, 4, 5:
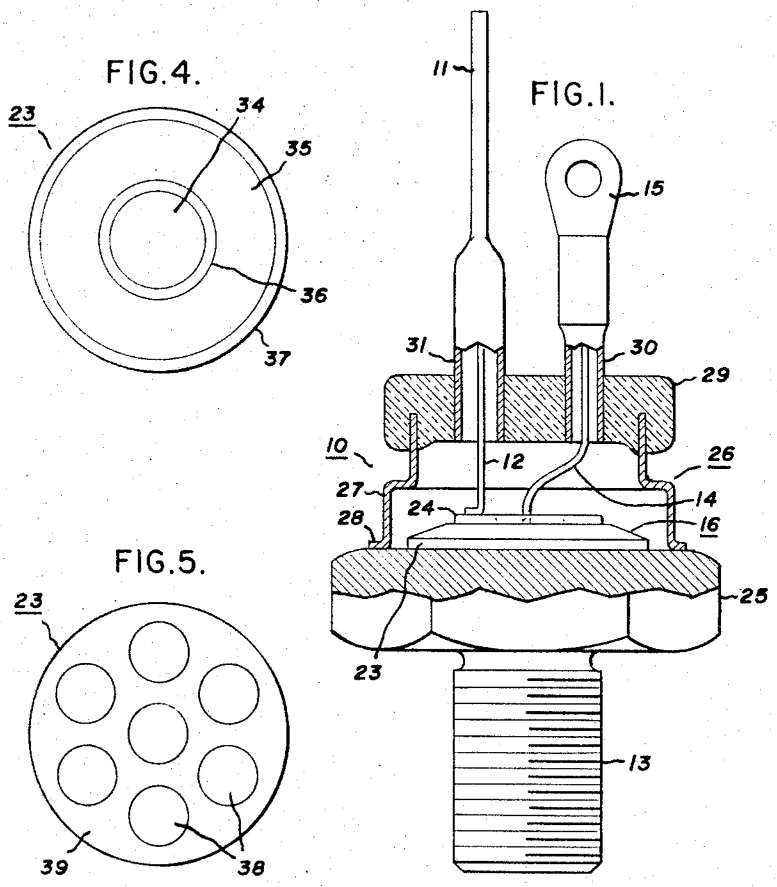
FIGURE 1 is a central vertical section through a semiconductor controlled rectifier utilizing support plates in accordance with the teachings of the present invention.
FIGURES 4 and 5 are plan views of other support plates which utilize principles of the present invention.

In FIGURE 1 a semiconductor junction type rectifier of the type known as a silicon controlled rectifier is shown mounted in a sealed, self-contained unit or housing which is referred to geneally by the reference character 10. The invention is shown and described in this setting because it is applied extensively to these devices and is particularly useful in the device illustrated. The operation of the silicon controlled rectifier illustrated is not described in detail here since a complete understanding of the operation of the device is not essential to an understanding of the invention and, further, the operation of such devices is discussed in a number of other places which are easily accessible. For example, the operation is described in chapter 1 of the General Electric Controlled Rectifier Manual, copyright 1960, by the General Electric Company. For this portion of the description, it should be sufficient to say that the main conduction path through the rectifier unit 10 is between an upper flat lead terminal 11 on the main or cathode conductive lead 12, a lower threaded bolt-like conductive terminal and heat sink 13 through the body of the device. Since current flow though the devices take place from the lower stud 13 through the body of the device to the upper conductive lead 12, the upper conductive lead 12 is frequently considered the device cathode and the lower stud 13 is considered the anode. Conduction does not take place (in any appreciable amount) in the opposite direction and the conduction which does take place is controlled in accordance with the characteristics of the device by a current (called a gate current) supplied to the rectifier through a gate lead 14 that extends out the top of the housing 29 adjacent to the cathode lead 12. The gate lead 14 is also provided with a flat conductive terminal 15 at its upper end.

The active control element of the device, that is, the part of the device which provides the rectifying and control action is the disc-shaped rectifying semiconductor pellet 16 (best seen in FIGURE 2) which is an element in the main conduction path. The semiconductor pellet 16 is a monocrystalline semiconductor material (silicon in the device illustrated) with three junctions between four layers which are of alternate conduction types. That is, the four layers alternately have an excess of free electrons (N-type conduction characteristics) and an excess of positive holes (positive or P-type conduction characteristics). Such a device is described as a P–N–P–N semiconductor switch. The layers of the particular device are all diffused in. The upper N type layer, in the device illustrated, is an annular ring.

In the unit illustrated, the semiconductor pellet is 300 mils in diameter and 7.5 mils thick. The thickness may best be visualized by considering that it is a little thinner than the pieces which would result from slicing a dime edgewise into five pieces of equal thickness. Obviously, such a thin piece of very brittle material is extremely fragile and junction locations are quite critical. The pellet is made even more fragile by the fact that its edge is beveled all the way around its periphery in order to insure that any device electrical breakdown occurs in the bulk of the semiconductor pellet 16 and not across its surface. It is difficult to provide contacts to the device which do not cause undue mechanical strain in the fragile pellet or impair electrical characteristics of the pellet.

In order to meet the critical requirements for low resistance contacts to the semiconductor pellet 16, the present invention incorporates a system of multilayer deposited contacts which makes it possible to take advantage of the properties of several metals. At the same time, the system lends itself to a one cycle pass through a vapor plater and provides a contact which acts as a buffer to reduce transmission of stress from the device conductors (which are connected to the contacts) to the device of pellet 16.

Cathode contact 17 (see FIGURE 2) on the upper side of pellet 16 and anode contact 19 on lower side of the pellet 16 constitutes a preferred contact structure and are formed by a preferred method. Since corresponding layers or laminations of each of the contacts 17 and 19 are formed at one time, they are, therefore, given corresponding reference numerals. In the embodiment illustrated here the first layer 20 (the layer on the pellet 16) of each contact is nickel and is approximately 0.01 to 0.03 mil thick, the second layer 21 (middle lamination) is an approximately 0.10 to .20 mil thick copper layer, and the outer layer 22 is gold layer approximately 0.05 to 0.10 mil in thickness.

The contact system and its method of application is more fully described (and claimed) in United States Patent 3,268,309, issued Aug. 23, 1966 to John N. Frank and Ronald A. Stott and assigned to the assignee of the present invention.

After the contacts 17 and 19 are formed the appropriate leads are connected to each. As illustrated, the gate lead 14 is connected at contact 18 by ultrasonically welding the lead 14 to the pellet 16. The gate contact 18 is centrally located within the upper annular N type emitter. The thin brittle semiconductor pellet 16 is supported by including it as the central element in a protective sandwich structure (see FIGURE 2). The remainder of the sandwich structure includes lower disc-shaped backup plate 23 and an upper annular ring shaped backup plate 24. These backup plates 23 and 24 form the outer layers of the supporting sandwich structure and form part of the conductive anode and cathode current paths respectively.

Figure 3:
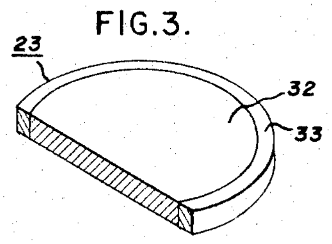
FIGURE 3 is a perspective view of a section through the lower support plate for the controlled rectifier of FIGURE 1.

The backup plates 23 and 24 provide a low total electrical and thermal resistance in the main current path of the controlled rectifier and, at the same time, provide the pellet protection and reduce stresses in the semiconductor pellet 16 to a point where the pellet is not fractured under thermal cycling. These results are accomplished by using a composite structure for lower backup plate 23 (see particularly FIGURE 3). The composite support plate 23 is composed of a centrally located highly conductive disk 32 (in this case copper) which also has a relatively high thermal coefficient of expansion and a surrounding and confining annular ring 33 which has a smaller thermal coefficient of expansion than the internal disk 32 in order to confine the central disk 32 during thermal cycling of the device. In this instance, the diameter of the centrally located disk 32 is about 200 mils. The thickness of the support plate is approximately 30 mils.

The upper annular support plate 24 is an annular disk having an outer diameter of approximately 200 mils and an inner diameter of approximately 100 mils, and a thickness of about 10 mils. In order to prevent an unbalance of stresses and consequent fracture of the semiconductor pellet, the upper backup plate or ring 24 is composed of a material which has a thermal coefficient of expansion that matches that of the restraining ring 33 on the lower backup plate (in this instance, a nickel-iron-cobalt composition known as Kovar).

The backup plates 23 and 24 are soldered to the pellet 16 by placing gold-germanium preforms between the backup plates and the pellet and heating the assembly to about 370° C. This temperature is under the nickel-silicon eutectic of around 900° C. so that the nickel of the first layer 20 does not disturb the silicon which is important when bonding to a pellet with thin diffused heat sensitive layers. The constituents of the solder scavenge (and bond well with) the outer gold layer 22 of the contacts but the internal copper layer 21 prevents the solder from disturbing the nickel layer 20 which is adjacent the silicon. This arrangement provides a good mechanical bond and the electrical and heat transferring qualities for such a connection.

The anode contact 19 of the pellet 16 is connected to the copper stud 13 through anode backup plate 23. That is, the sandwich just described is mounted to the anode lead (copper stud 13) by soldering the anode backup plate 23 to the upper surface of an enlarged head or pedestal 25 provided on copper stud 13. The cathode lead 12 is soldered to the upper annular backup plate 24 in order to provide the cathode connection for the device.

In order to provide a hermetic enclosure and at the same time provide external electrical connections to the cathode and gate leads 12 and 14, a cap 26 is provided. The cap 26 has an essentially cylindrical upstanding metal portion 27 which surrounds inside the device sandwich and is provided with an outwardly extending flange 28 around its lower periphery. The flange 28 is designed to fit on the upper surface of the enlarged portion 25 of stud 13 and be sealed thereto, as by welding or brazing. An insulating cap of material such as glass or ceramic is provided as a closure for the upper part of the cylindrical metal portion 27 for the purpose of holding a cathode tubulation 31 and a gate tubulation 30 and to to insulate these tubulations from the stud 13 (anode lead) when the device is assembled. The cathode and gate leads 12 and 14 respectively are brought up in their respective tubulations 31 and 30. After the housing is evacuated, the tubulations 31 and 30 are pinched off to form good electrical connections with the leads (12 and 14) pressed therein and to form the device cathode and gate terminals 11 and 15 respectively.

Figure 2:
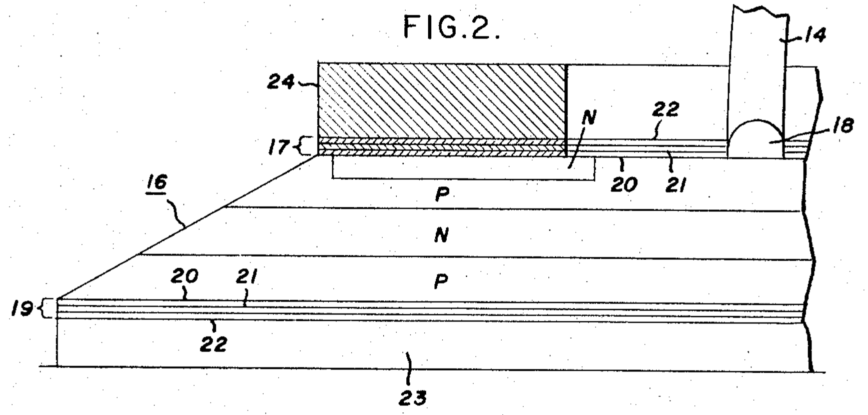
FIGURE 2 is an enlarged elevational view partially in section of the rectifying element (including connections) of the controlled rectifier of FIGURE 1.

Other embodiments of composite support plates which may be utilized in the controlled rectifier of FIGURES 1 and 2 are illustrated in FIGURES 4 and 5. In these figures the composite support plates are given the reference numeral 23 because they may be substituted directly for the lower plate 23 in the rectifier illustrated.

In the embodiment of FIGURE 4 the main current and heat conduction takes place through highly conductive central disk 34 and annular ring 35 (both of copper here). The center disk 34 is surrounded and constrained by annular ring 36 which is located within and in intimate contact with the highly conductive ring 35. Another restraining ring 37 surrounds the structure and is in intimate contact with the next inner ring 35.

Both the outer ring 37 and the inner ring 36 are made of a material, for example, Kovar, which has a low thermal coefficient of expansion relative to the material of center disk 34 and ring 35. In order further to reduce stress transmitted to the semiconductor body through the support plate, the number of restraining rings can be increased. The same general result may be obtained, of course, if the center disk is made of the restraining material and the position of the restraining and other conducting rings interchanged but each of the other conductors are preferably surrounded by restraining rings.

In the embodiment of the invention illustrated in FIGURE 5, a number of highly conductive (copper here) disks 38 are inset in apertures in a larger disk-shaped plate 39 of material which constitutes the restraining material for the conductive disks. Again, the restraining material of restraining plate 39 has a much lower coefficient of thermal expansion than that of the conductive disks 36. Kovar is also a satisfactory material for this embodiment.

While a particular embodiment of the invention has been shown and described it will, of course, be understood that the invention is not limited thereto since many modifications varied to fit particular operating requirements and environments will be apparent to those skilled in the art. The invention may be used to perform similar functions and its peculiar properties taken advantage of in other semiconductor devices utilizing other materials than those described without departing from the concept of the invention. Accordingly, the invention is not considered limited to the examples chosen for the purposes of disclosure and it is contemplated that the appended claims will cover any such modifications as fall within the true spirit and scope of the invention.

What we claim as new and desire to secure by Letters Patent of the United States is:

1. In a semiconductor device of the rectifying junction type, a body of semiconductor material, a composite support plate for said body and solder means connecting said composite support plate and said semiconductor body; said composite support plate comprising a disk-shaped member having two major opposed faces and lateral dimensions comparable to that of said body of semiconductor material, said composite support plate being thin relative to its lateral dimensions and consisting of at least one disk of material having relatively high thermal and electrical conductivity and a relatively high thermal coefficient of expansion and at least a second material defining a restraining member having a low thermal coefficient of expansion relative to said disk, surrounding and confining the peripheral dimensions of said one disk of material whereby the composite characteristic of said support plate reduces strain in said semiconductor body under thermal cycling.

2. A structure as defined in claim 1 wherein said restraining member is an annular ring.

3. A structure as defined in claim 2 wherein said disk is copper and said restraining ring is of a nickel-iron alloy.

4. A semiconductor device of the rectifying junction type including in combination a body of semiconductor material, a composite support plate secured to one surface of said semiconductor body, an electrical conductor comprising one of the device electrodes connected to the opposite surface of said support plate, at least one additional electrical connector forming a device electrode electrically connected to the opposite surface of said semiconductor body, said composite support plate comprising a disk-shaped member having two major opposed faces and lateral dimensions comparable to that of said body of semiconductor material, said composite support plate being thin relative to its lateral dimensions and comprising a single disk of material and an annular restraining ring surrounding and confining the peripheral dimensions of said single disk, said single disk consisting of material having high electrical and thermal conductivity relative to said semiconductor body and a high thermal coefficient of expansion relative to said semiconductor body and said restraining ring consisting of a material having a low thermal coefficient of expansion relative to said disk whereby said annular ring confines and restrains said single disk under elevated temperatures and the composite characteristic of said support plate reduces strain in said semiconductor body under thermal cycling.

5. A semiconductor device as defined in claim 4 wherein said disk is copper and said restraining ring is a nickel-iron alloy.

6. A semiconductor device of the rectifying junction type including in combination a body of semiconductor material, a composite support plate secured to one surface of said semiconductor body, a second support plate secured to the opposite surface of said semiconductor body, an electrical conductor comprising one of the device electrodes connected to the opposite surface of said support plate, at least one additional electrical connector electrically connected to said second support plate, said composite support plate comprising a disk-shaped member having two major opposed faces and lateral dimensions comparable to that of said body of semiconductor material, said composite support plate being thin relative to its lateral dimensions and comprising a single disk of material and an annular constraining ring surrounding and confining the peripheral dimensions of said disk, said single disk consisting of material having high electrical and thermal conductivity relative to said semiconductor body and a high thermal coefficient of expansion relative to said semiconductor body, and said ring consisting of a material having a low thermal coefficient of expansion relative to said disk whereby said annular ring confines and restrains said single disk under elevated temperatures and the composite characteristic of said support plate reduces strain in said semiconductor body under thermal cycling.

7. A semiconductor device as defined in claim 6 wherein said disk is copper and said restraining ring is a nickel-iron alloy.

8. A semiconductor device as defined in claim 7 wherein said second support plate constitutes an annular disk-shaped member.

9. A semiconductor device of the rectifying junction type including in combination a body of semiconductor material, a composite support plate secured to one surface of said semiconductor body, a second support plate secured to the opposite surface of said semiconductor body, said second support plate comprising a disk-shaped annular member with a centrally located aperture, an electrical conductor comprising one of the device electrodes connected to the opposite surface of said support plate, a second electrical connector electrically connected to said second support plate and a third electrode electrically connected to the same surface of said semiconductor body as said second support plate and within the said centrally located aperture, said composite support plate comprising a disk-shaped member having two major opposed faces and lateral dimensions comparable to that of said body of semiconductor material, said composite support plate being thin relative to its lateral dimensions and comprising a single disk of material and an annular restraining ring surrounding and confining the peripheral dimensions of said single disk, said single disk consisting of material having high electrical and thermal conductivity relative to said semiconductor body and a high thermal coefficient of expansion relative to said semiconductor body, and said ring consisting of a material having a low thermal coefficient of expansion relative to said disk whereby said annular ring confines and restrains said single disk under elevated temperatures and the composite characteristic of said support plate reduces strain in said semiconductor body under thermal cycling.

10. A semiconductor device as defined in claim 9 wherein the disk-shaped portion of said composite support plate is copper and said annular restraining ring is a nickel-iron alloy.

11. A semiconductor device of the rectifying junction type including in combination, a body of semiconductor material, a composite support plate, and solder means connecting said semiconductor body to said composite support plate, said composite support plate including a centrally located disk surrounded and confined by a plurality of concentric annular rings, said centrally located disk and alternate rings being of a material having a high thermal and electrical conductivity relative to said semiconductor body, said annular ring immediately surrounding said disk and alternate rings constituting restraining rings composed of a material having a low coefficient of thermal expansion relative to that of said disk whereby the composite characteristic of said support plate reduces strain in said semiconductor body under thermal cycling.

12. A semiconductor device of the rectifying junction type including in combination, a body of semiconductor material, a composite support plate, and solder means connecting said semiconductor body to said composite support plate, said composite support plate including a plurality of conductive members of a material having high thermal and electrical conductivity relative to said semiconductor body and an electrically conductive plate-like constraining member of a material having a low coefficient of thermal expansion relative to said conductive members, each of said plurality of conductive members set in said plate-like constraining member in intimate constrained contact therewith whereby the composite characteristics of said support plate reduces strain in said semiconductor body under thermal cycling.

13. A semiconductor device of the rectifying junction type including in combination, a body of semiconductor material, a composite support plate, and solder means connecting said semiconductor body to said composite support plate, said composite support plate including a plurality of conductive members, said conductive members comprising a centrally located disk surrounded by a series of concentric annular rings in intimate contact, at least a first set of alternate ones of said conductive members being of a material having higher thermal and electrical conductivity than said semiconductor body, and the other set of alternate ones of said conductive members constituting restraining members of a material having a low coefficient of thermal expansion relative to that of said first set of conductive members whereby the composite characteristic of said support plate reduces strain in said semiconductor body under thermal cycling.

References Cited

UNITED STATES PATENTS

| | | | |
|---|---|---|---|
| 3,128,419 | 4/1964 | Walkotter et al. | 317—234 |
| 3,268,309 | 8/1966 | Frank et al. | 29—195 |
| 3,273,029 | 9/1966 | Ross | 317—234 |
| 3,295,089 | 12/1966 | Moore | 338—204 |
| 3,296,501 | 1/1967 | Moore | 317—234 |

FOREIGN PATENTS

| | | |
|---|---|---|
| 893,493 | 4/1962 | Great Britain. |

JOHN W. HUCKERT, *Primary Examiner.*

A. M. LESNIAK, *Assistant Examiner.*